(12) United States Patent
Kosugi

(10) Patent No.: US 7,068,505 B2
(45) Date of Patent: Jun. 27, 2006

(54) AIR DUCT AND ELECTRONIC EQUIPMENT USING THE AIR DUCT

(75) Inventor: Naofumi Kosugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 10/740,841

(22) Filed: Dec. 22, 2003

(65) Prior Publication Data

US 2004/0184234 A1 Sep. 23, 2004
US 2005/0036287 A2 Sep. 23, 2004

(30) Foreign Application Priority Data

Jan. 28, 2003 (JP) .................................. 2003-019432

(51) Int. Cl.
*H05K 7/20* (2006.01)

(52) U.S. Cl. .................. 361/690; 361/694; 361/695; 174/16.1; 165/104.33; 165/122; 454/184

(58) Field of Classification Search ......... 361/687–690, 361/694, 695, 719; 174/16.1, 16.3; 165/80.3, 165/104.33, 122; 454/184
See application file for complete search history.

(56) References Cited

U.S. PATENT DOCUMENTS

| | | | |
|---|---|---|---|
| 4,793,643 A | 12/1988 | Ahad et al. | |
| 5,456,632 A * | 10/1995 | Ohtsu et al. | 454/184 |
| 5,473,507 A | 12/1995 | Schwegler et al. | |
| 5,822,186 A | 10/1998 | Bull et al. | |
| 6,040,981 A | 3/2000 | Schmitt et al. | |
| 6,226,182 B1 | 5/2001 | Maehara | |
| 6,330,154 B1 * | 12/2001 | Fryers et al. | 361/695 |
| 6,462,948 B1 * | 10/2002 | Leija et al. | 361/697 |
| 6,525,937 B1 * | 2/2003 | Yanagida | 361/695 |
| 6,556,440 B1 * | 4/2003 | Jensen et al. | 361/687 |
| 6,587,342 B1 | 7/2003 | Hsu | |
| 6,654,242 B1 * | 11/2003 | Ogawa | 361/687 |
| 6,678,157 B1 * | 1/2004 | Bestwick | 361/695 |
| 6,721,180 B1 * | 4/2004 | Le et al. | 361/695 |

FOREIGN PATENT DOCUMENTS

| | | |
|---|---|---|
| JP | 5-251875 | 9/1993 |
| JP | 2000-22375 | 1/2000 |
| JP | 2000-138487 | 5/2000 |
| JP | 2000-323878 | 11/2000 |
| JP | 2002-190685 | 7/2002 |

OTHER PUBLICATIONS

U.S. Appl. No. 10/740,797, filed Dec. 22, 2003, Naofumi Kosugi, Fujitsu Limited Kawasaki, Japan.
Office Action issued by the U.S. Patent and Trademark Office on Apr. 22, 2005 in Application No. 10/740,797 filed Dec. 22, 2003.
Office Action issued on Jul. 2, 2005 by the Chinese Patent Office.

* cited by examiner

Primary Examiner—Boris Chervinsky
(74) Attorney, Agent, or Firm—Staas & Halsey LLP

(57) ABSTRACT

The invention relates to an air duct for allowing cooling air to flow toward an electronic equipment, and provides the air duct for allowing cooling air to flow installed in a space in the equipment and also provides an electronic equipment using the same air duct. The air duct is structured to be formed of an elastic material, and has a duct body, a ventilation paths an intake part, and an exhaust part. The duct body is detachably installed in a space of an interior of the equipment, and the ventilation path through which air passes is formed in the duct body, and an intake part for taking air in the ventilation path and an exhaust part for exhausting air through the ventilation path are formed respectively in the duct body.

8 Claims, 21 Drawing Sheets

F I G. 4
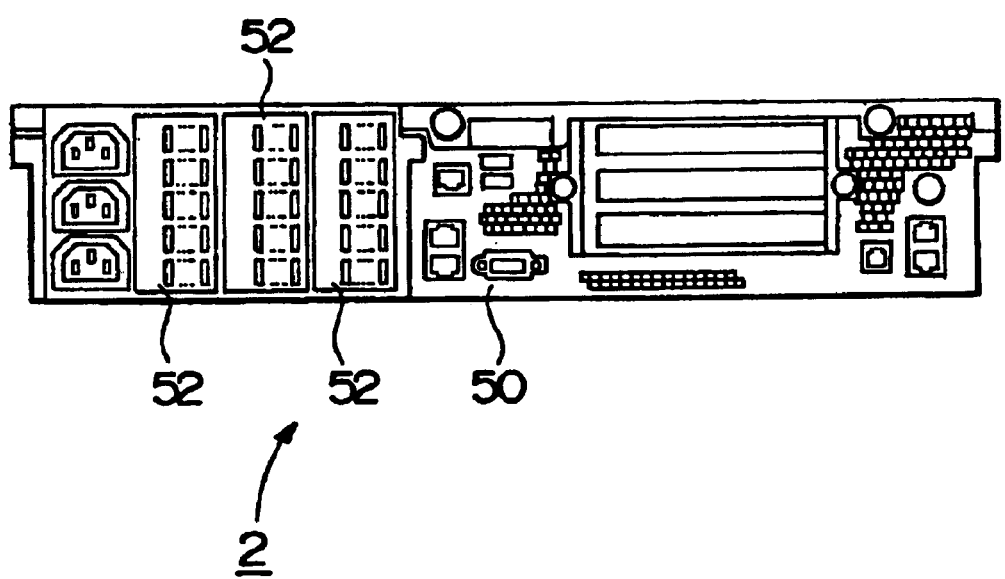

F I G. 6
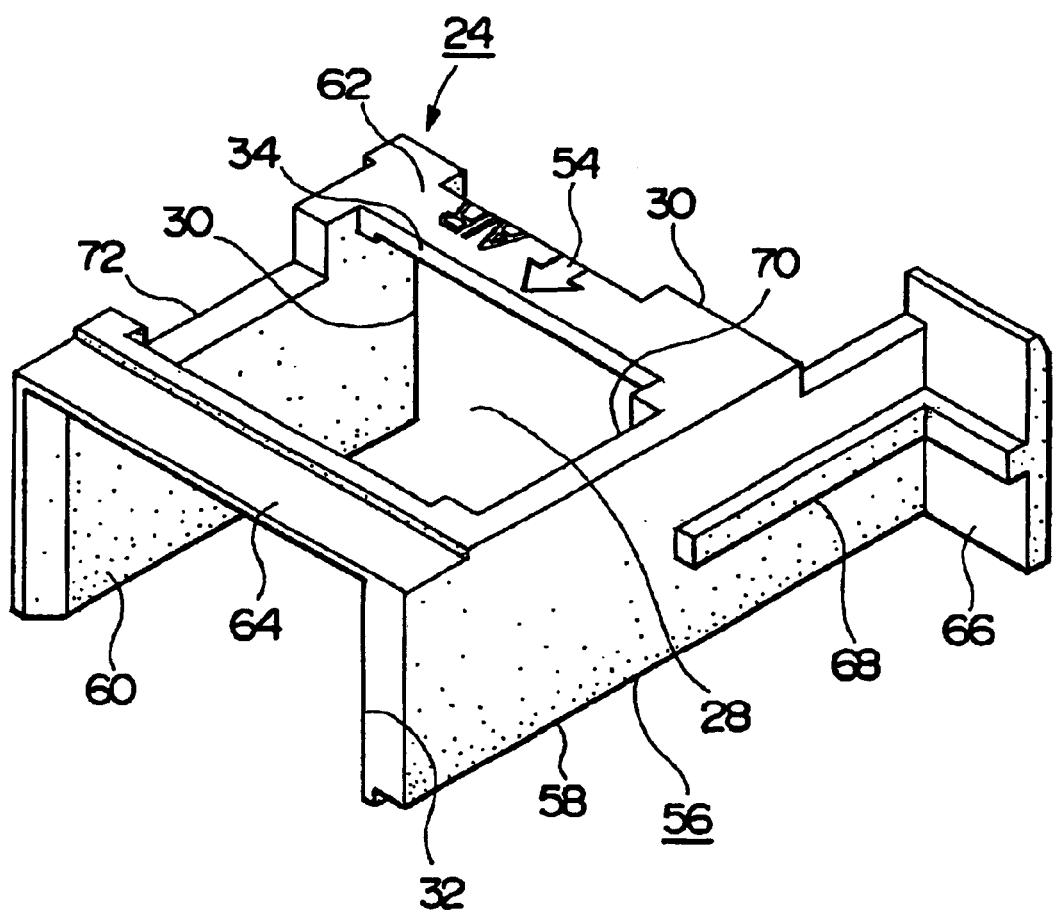

AIR DUCT AND ELECTRONIC EQUIPMENT USING THE AIR DUCT

BACKGROUND OF THE INVENTION

1. Field of the Invention

The invention relates to an air duct for forming an air path in a space inside electronic equipment, particularly, an air duct having a structure which is easily disassembled and assembled and electronic equipment using the air duct.

2. Description of the Related Art

Heat radiation and cooling in electronic equipment are conventionally indispensable to prevent the deterioration and keep stability and reliability of the operation of the electronic equipment. A cooling fan has been generally used for cooling the electronic equipment, and heating portion such as heating components and the like is cooled by air which is taken in the electronic equipment. For example, if a cooling fan is installed at the rear panel side to exhaust air, cooling air is sucked from the front panel side and so forth into the electronic equipment and it flows in the electronic equipment so that the heating portion is cooled by the cooling air which passes in the electronic equipment.

There are prior art patent references for disclosing a technique relating to an attachment structure and a cooling structure of a cooling fan of electronic equipment such as U.S. Pat. No. 5,473, 507, JP-A 05-251875, JP-A 2000-22375, JP-A 2000-323878 and so forth.

U.S. Pat. No. 5,473,507 and JP-A 05-251875 disclose electronic equipment, wherein the electronic equipment and a chassis for installing the electronic equipment are respectively made of a plastic material and an air duct is formed by the chassis and so forth for supplying cooling air to electronic elements to be cooled. The JP-A 2000-22375 discloses a fixture structure of the fan unit in which the replacement of the fan unit is made easily when it is troubled. JP-A 2000-323878 discloses a cooling structure of electronic equipment comprising a housing of the electronic equipment and a frame body formed of an elastic member disposed between the housing and a sealed case which is disposed in the housing, thereby forming a wind tunnel serving as a cooling duct.

Meanwhile, with the technique disclosed in U.S. Pat. No. 5,473,507 and JP-A 05-251875, the chassis for mounting components of the electronic equipment and so forth on a housing of the electronic equipment is formed of the plastic material and the components are mounted on the chassis. The chassis has a ventilator for drawing air from the outside at the position corresponding to a wind tunnel slot of a front face cover, and the cooling air current produced in the chassis by the ventilator passes from the opening of the chassis, through the opening of the back face plate and a slit of a back face cover plate, and flows outside. That is, the structure for supplying the cooling air current by the chassis and ventilator to the components to be cooled is the same as the cooling structure of the conventional electronic equipment, and the difference therebetween resides in whether the chassis is formed of metal or plastic material. Further, with such a chassis structure, it is not possible to design the air duct and the housing separately from each other so that they can not be assembled or disassembled. Replacement of the ventilator requires an operation for removing the front cover plate and the front face sealed plate, then removing a metallic enclosure enclosing the chassis, and separating the upper portion from the lower portion of the chassis, which is very troublesome and takes labor.

Further, with the technique disclosed in JP-A 2000-22375, it merely discloses a fixture structure of a fan unit, which cannot constitute an air duct inside the electronic equipment.

Still further, with the technique disclosed in JP 2000-323878A, a circuit board is installed in a space enclosed by a chassis and a top plate, and a fan is installed on a ceiling part of a sealed case covering the upper face part of the circuit board, and wherein cooling air is sucked from a bottom face side of the sealed case, then it is allowed to pass through heating components on the circuit board, thereafter it is allowed to flow out from a heat radiating holes of the top plate, thereby cooling the circuit board enclosed by the chassis, the top plate and the sealed case. This technique is however discloses that the chassis per se is merely rendered to be air duct, and an air duct is not formed relative to a specific component, and the replacement of a fan requires the operation for removing the top plate from the chassis and removing the sealed case from the chassis, which is very troublesome and takes labor.

SUMMARY OF THE INVENTION

The invention relates to an air duct for allowing a cooling air to flow in electronic equipment, and it is an object of the invention to provide the air duct for allowing the cooling air to flow while installed in a space inside the electronic equipment. It is another object of the invention to provide electronic equipment using such an air duct.

To achieve the above object, the air duct and electronic equipment of the invention are structured as follows.

To achieve the above object, the air duct of the invention is an air duct 24 formed of an elastic material, and has a duct body 56, a ventilation path 28, an intake part 30, and an exhaust part 32. The duct body is installed detachably in a space 20 of the interior of the equipment, and the ventilation path through which air is allowed to pass toward the duct body is formed in the duct body. The intake part for taking air in the ventilation path and the exhaust part for exhausting the air through the ventilation path are formed respectively in the duct body.

With the structure of such an air duct, since the duct body can be detachably installed in the space of the interior of the equipment and the ventilation path is provided in the duct body, it is possible to take a cooling air from the intake part into the ventilation path, to allow the cooling air to flow out from the exhaust part. Accordingly, the air duct singly can implement its function, and also since it is formed of the elastic material, the duct body can be deformed to be detachably installed and held in the space of the interior of the equipment.

With such an air duct, the duct body may be held in the space of the interior of the equipment utilizing the property of the elastic material forming the duct body. As an embodiment, for example, if at least a part of the shape of the duct body is conformed to that of the space defined in the interior of the equipment, the duct body can be clamped in the space to be detachably held.

With such an air duct, the duct body having the ventilation path, the intake part and the exhaust part may be structured, for example, by a first vertical wall 58, a second vertical wall 60, bridging parts 62, 64. That is, the first vertical wall is provided along a member facing the space of the interior of the equipment, and the second vertical wall is spaced from the first vertical wall, and provided along the member facing the space, and then the bridging parts bridge over the first vertical wall and the second vertical wall, wherein the first vertical wall and second vertical wall are supported by the bridging parts. As mentioned above, the duct body can form the ventilation path, the intake part, the exhaust part with a simple structure, and it singly implement a duct function.

With such an air duct, the ventilation path is not necessary to have the construction which is sealed by the duct body alone, and it may be structured to include a part of a housing of the equipment in which the duct body is installed. With such a structure, wall faces of the housing and so forth are utilized as a part of the ventilation path so that ventilation capacity of the ventilation path, and the section of the ventilation can be secured by the utilization of such wall faces.

With such an air duct, a fan unit may be detachably installed in the ventilation path. If a window through which the fan unit can pass is provided in the ventilation path, the fan unit can be attached to, or detached from the ventilation path through the window.

With such an air duct, the duct body may be structured to have an electromagnetic shielding function. With such a structure, the electronic equipment can be electromagnetically protected With such an air duct, the ventilation path may be structured by the single number or multiple number, for example, the ventilation path is branched to guide ventilation at not less than two places in the interior of the equipment. In this case, the cooling air is allowed to flow by the fan unit which is installed commonly in the ventilation path at multiple spots.

With such an air duct, the duct body may be structured to provide a static stopper function, and installed at the portion to be cooled on a printed circuit board. With such a structure, the duct body 56 can be directly installed on the portion to be cooled on the printed circuit board so as to allow the cooling air to flow to the portion to be cooled.

To achieve the above object, the duct body of this air duct may be structured to be formed by flexible plastics, or may be structured to be clamped in a space between a bottom face part and an upper face part of a housing of the equipment to be retained thereby, or may be structured such that the window is closed by a part of the housing of the equipment.

Further, electronic equipment of the invention is electronic equipment having one or not less than two various equipment in a housing and has the air duct 24 and a fan unit 26. The air duct 24 is detachably installed in the space 20 of the housing (exterior case 4, top plate 36) to form the ventilation path 28 through which the air is allowed to flow in the housing. The fan unit is installed in the air duct, and the cooling air is forced to flow through the ventilation path. With such a structure, the cooling air can be allowed to flow in the equipment through the air duct, and the air duct can be easily detached and attached. Further, it is possible to realize the electronic equipment having high cooling effect and the fan unit 26 installed in the air duct 24 can be easily replaced with another.

With such electronic equipment, a first window 34 through which the fan unit 26 is attached to, or detached from the air duct 24 is formed in the air duct, and a second window 40 corresponding to the first window 34 is formed in the housing (top plate 36) of the electronic equipment, wherein the first window and the second window can be opened or closed by a cover member 44 provided in the housing so that the first and second windows can be opened or closed by the cover member 44 and the fan unit can be easily attached to, or detached from the air duct through the first and second windows.

To achieve the above object, an electronic equipment of the invention forms a space between low heat generation equipment and high heat generation equipment, and an air duct and a fan unit are installed in the space, wherein cooling air which is forced to flow through the low heat generation equipment may be allowed to flow toward the high heat generation equipment.

Other objects, features and advantages of the invention will be made more clear with reference to the attached drawings and each of the embodiments.

BRIEF DESCRIPTION OF THE DRAWINGS

FIG. 4 is a plan view showing a rear face panel of the electronic equipment;

FIG. 6 is a perspective view showing the air duct as viewed from an exhaust part side;

DETAILED DESCRIPTION OF THE PREFERRED EMBODIMENTS

Figure 1:
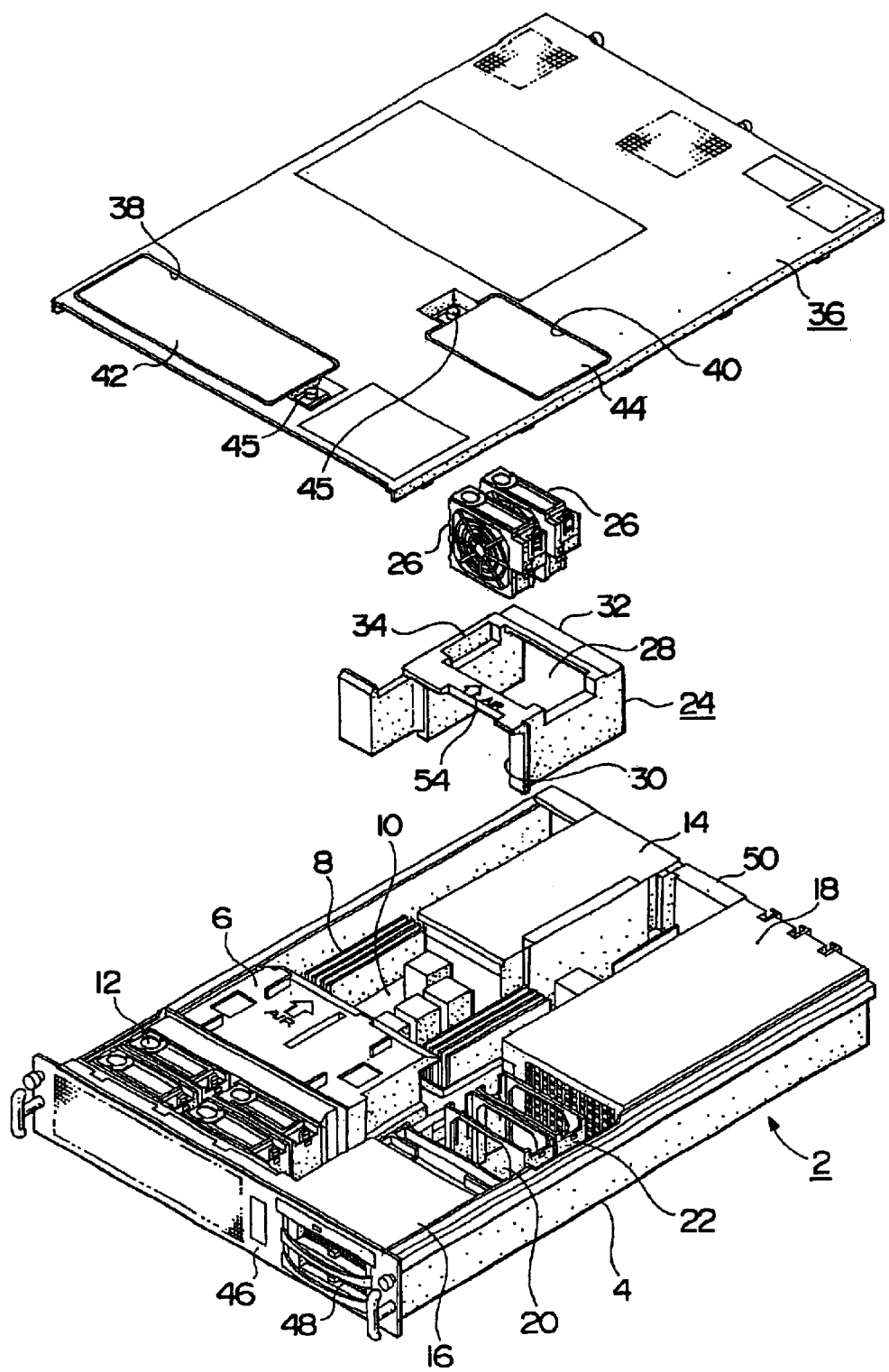
FIG. 1 is a perspective view showing an air duct and electronic equipment according to a first embodiment of the invention.
Figure 2:
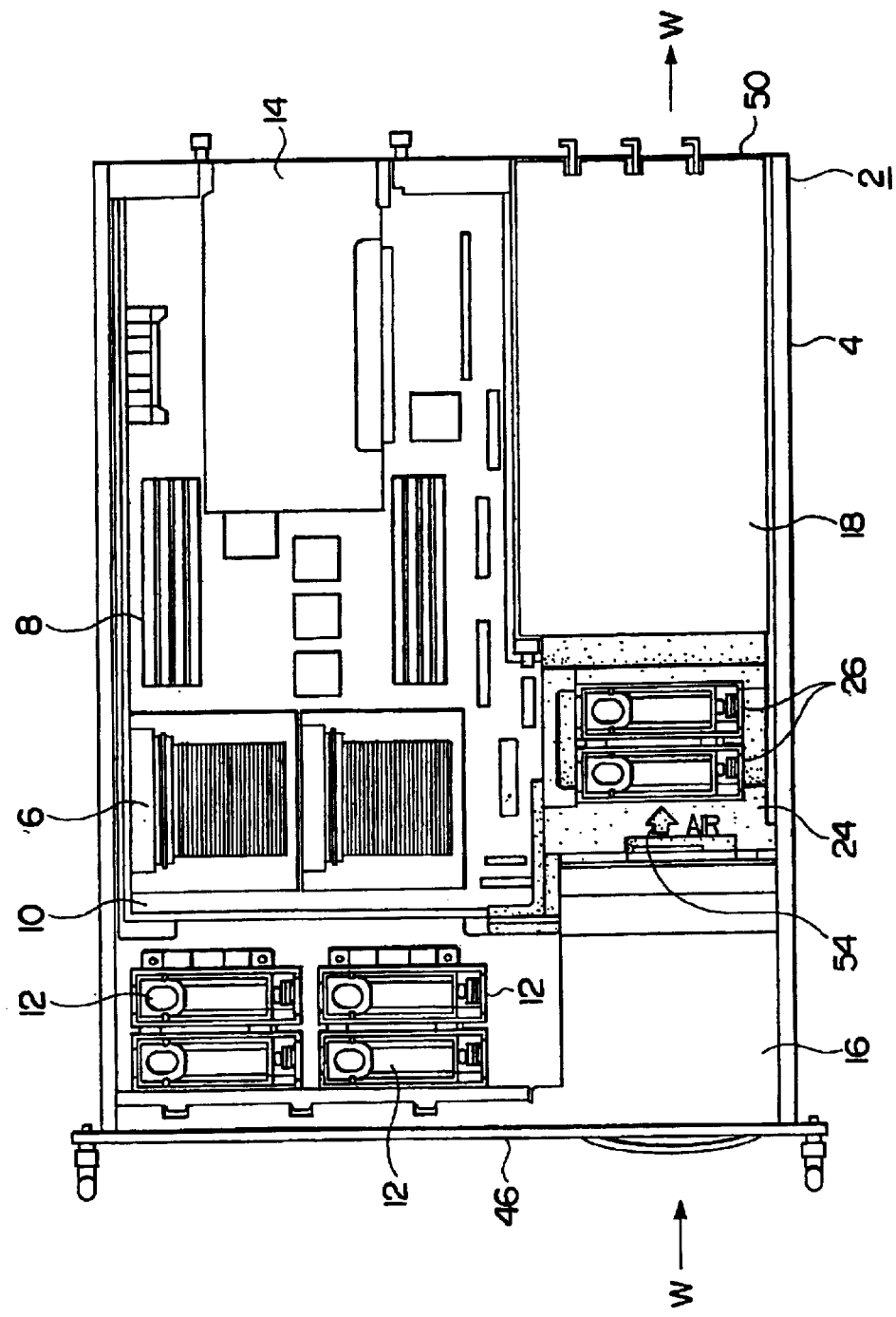
FIG. 2 is a plan view showing the electronic equipment in which the air duct is installed.
Figure 3:
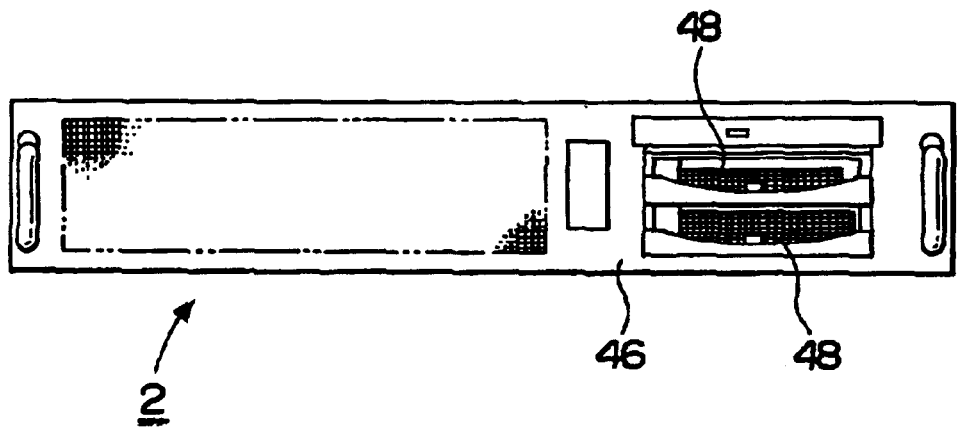
FIG. 3 is a plan view showing a front face panel of the electronic equipment.

First Embodiment:

A first embodiment of the invention is now described. FIGS. 1 to 4 show an air duct and electronic equipment according to the first embodiment of the invention, wherein FIG. 1 shows the electronic equipment from which a top plate, a fan unit and the air duct are separated, FIG. 2 shows an interior of the electronic equipment in which the air duct is installed, FIG. 3 shows a front face panel of the electronic equipment, and FIG. 4 shows a rear face panel of the electronic equipment.

An electronic equipment 2 has an exterior case 4 serving as a housing, and there are provided in the exterior case 4 a plurality of circuit elements constituting the electronic equipment 2, components of a circuit board such as a circuit board 10 on which a plurality of CPUs (Central Processing Unit) 6, a memory 8 and so forth are mounted, a fan unit 12, a PCI (Peripheral Component Interface) 14, a hard disk 16, a power supply 18, and so forth, thereby constituting a server serving as information processing unit. A space 20 is formed between the hard disk 16 and the power supply 18, and a support frame 22 and an air duct 24 are provided in the space 20. The support frame 22 is a member for supporting the fan unit 12, in this case it supports two fan units 26. The air duct 24 is installed in the space 20 in the periphery of the fan unit 26 and the support frame 22, wherein a ventilation path 28 formed in the air duct 24 communicates with the hard disk 16, the fan unit 26 and the power supply 18. The space 20 in which the air duct 24 is attached to is formed in the periphery of the support frame 22. In this case, there are formed in the air duct 24 an intake part 30 at one side of the ventilation path 28 and an exhaust part 32 at the other side of the ventilation path 28 and a first window 34 at the upper part thereof.

A top plate 36 serving as a member for closing the upper face side opening of the exterior case 4 is provided, wherein a window 38 through which the fan unit 12 is attached to, or detached from the electronic equipment, and a second window 40 through which the fan unit 26 is attached to, or detached from the electronic equipment, are formed on the top plate 36, respectively, and also cover members 42, 44 are openably and closably provided on the windows 38, 40. Fixed screws 4.5 are attached to the top plate 36 so as to fix the cover members 42, 44 to the top plate 36.

With the structure of the electronic equipment 2 in which the air duct 24 is installed and the support frame 22 and the fan unit 26 are mounted on the ventilation path 28, wherein the hard disk 16 and the power supply 18 communicate with each other through the ventilation path 28 of the air duct 24 as shown in FIG. 2, wherein the fan unit 26 is installed in the electronic equipment 2.

Slits 48 for sucking air are provided at the hard disc unit 16 side on a front face panel 46 which is installed at the front face side of the electronic equipment 2. Exhaust slits 52 are provided at the power supply 18 side on a back face panel 50 which is installed at the back face side of the electronic equipment 2.

With such a structure, if the fan unit 26 is turned to generate a suction air is generated according to an air flow display 54, a cooling air W is taken from the slit 48 of the front face panel 46 into the interior of the exterior case 4, which in turn flows from the hard disk 16 side to the power supply 18 side through the ventilation path 28 of the air duct 24, and it is allowed to flow out through the slit 52 of the rear face panel 50. In this case, the heating temperature of the hard disk 16 is lower than that of the power supply 18, and hence the power supply 18 is sufficiently cooled by the cooling air W which cooled the hard disk 16.

Figure 5:
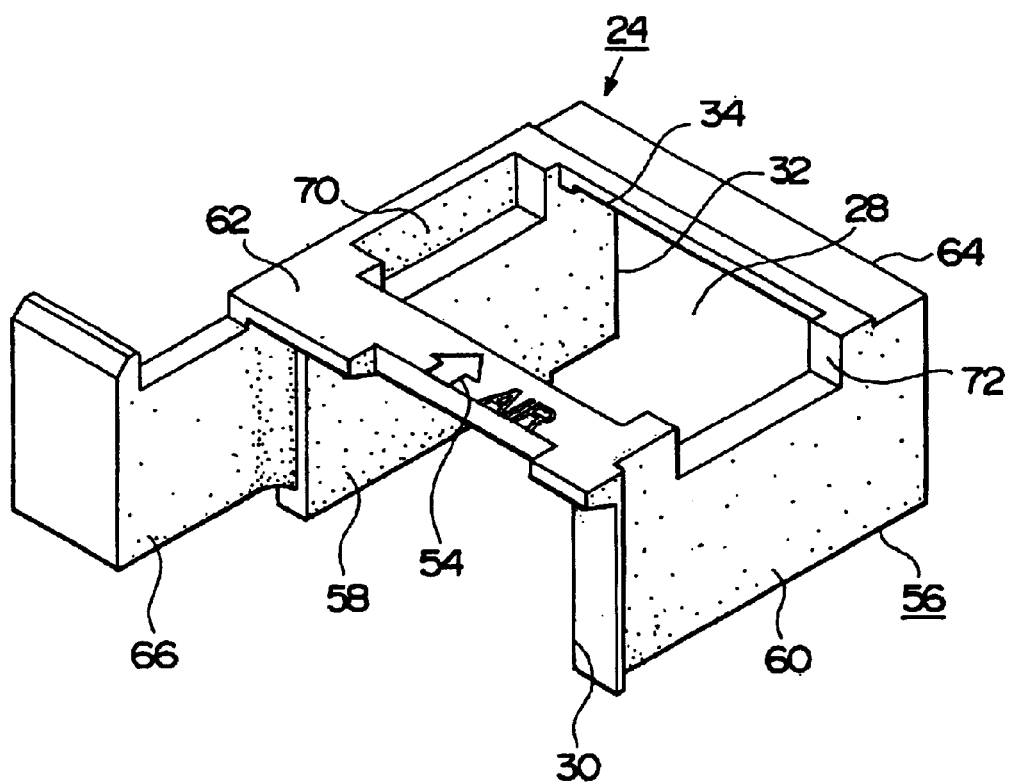
FIG. 5 is a perspective view showing the air duct as viewed from an intake part side.

The air duct 24 is structured by a single member formed of an elastic material such as foaming plastic and so forth, and it has a single duct body 56 as shown in FIGS. 5 and 6. FIG. 5 shows the air duct 24 as viewed from the intake part 30 side, and FIG. 6 shows the air duct 24 as viewed from the exhaust part 32 side. As the foaming plastics, for example, there are polypropylene, an ABS resin, and so forth can be used.

The duct body 56 has a first vertical wall 58, a second vertical wall 60 and first and second bridging parts 62, 64 for supporting the first vertical wall 58, and the second vertical wall 60 at a predetermined interval, and there is formed the ventilation path 28 by the first vertical wall 58, second vertical wall 60 and the bridging parts 62, 64 wherein a first window 34 is formed with the same interval as the bridging parts 62, 64. In this case, the first vertical wall 58 and the second vertical wall 60 are formed of plate shaped members each standing upright from the bottom face part of the exterior case 4, while the intake part 30 is formed by the edge part of the plate shaped member in the horizontal direction thereof and the bridging parts 62, 64, and the exhaust part 32 is formed opposite to the intake part 30. In the air duct 24, the lower edge sides of the first vertical wall 58 and the second vertical wall 60 are opened, and a part of the exterior case 4 is utilized together with the first and second vertical walls 58, 60 and the bridging parts 62, 64 as members to encircle the ventilation path 28. An L-shaped support wall 66 is formed at the edge part of the intake part 30 side of the first vertical wall 58 and a rib 68 serving as a reinforcing member is formed on the rear face of the L-shaped support wall 66, as shown in FIG. 6. Further, recesses 70, 72 are formed on the upper edge of the first and second vertical wall 58, 60 and they provide room for facilitating the attachment or the detachment of the fan unit 26.

Figure 7:
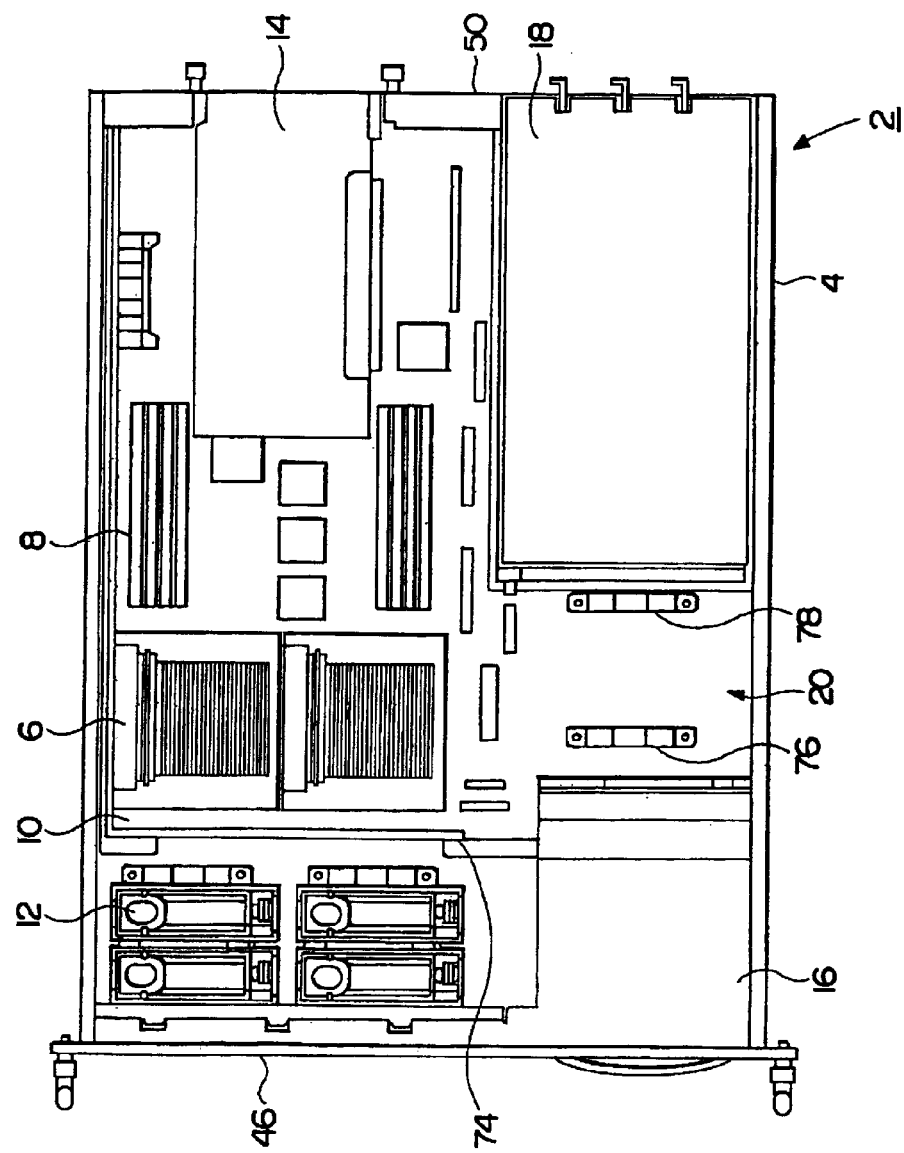
FIG. 7 is a plan view showing the electronic equipment before the air duct is installed in the electronic equipment.

The space 20 for installing the air duct 24 is formed in the electronic equipment 2 in which the air duct 24 is installed, as shown in FIG. 7. FIG. 7 shows the electronic equipment 2 before the air duct 24, the support frame 22 and the fan unit 26 are installed in the electronic equipment 2.

Figure 8:
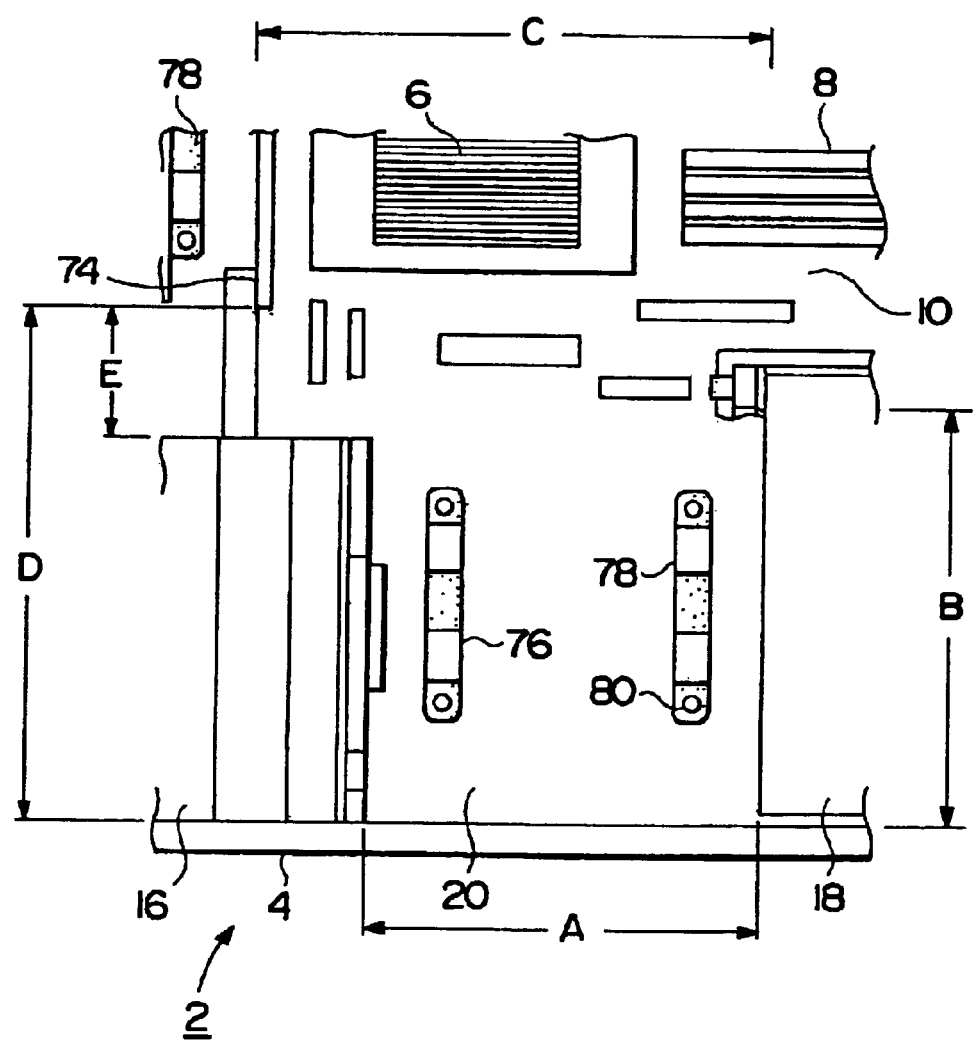
FIG. 8 is an enlarged view showing a space in which the air duct is installed.

With the electronic equipment 2 having such a structure, the space 20 is formed between the CPU 6 and the hard disk 16, and also between the circuit board 10 and the exterior case 4 as shown in FIG. 8, and there are formed, for example, intervals A, B, C, D, and E between face parts of the members corresponding to the air duct 24. The interval E is formed between an vertical wall 74 which stands upright at the circuit board 10 side and a wall face of the hard disk 16. There exists an interval F (FIG. 10) between the bottom face of the exterior case 4 and the inner face of the top plate 36. These intervals A, B, C, D and E depict an example of the electronic equipment 2 in view of the description thereof, and do not show universal intervals or dimensions.

Figure 9:
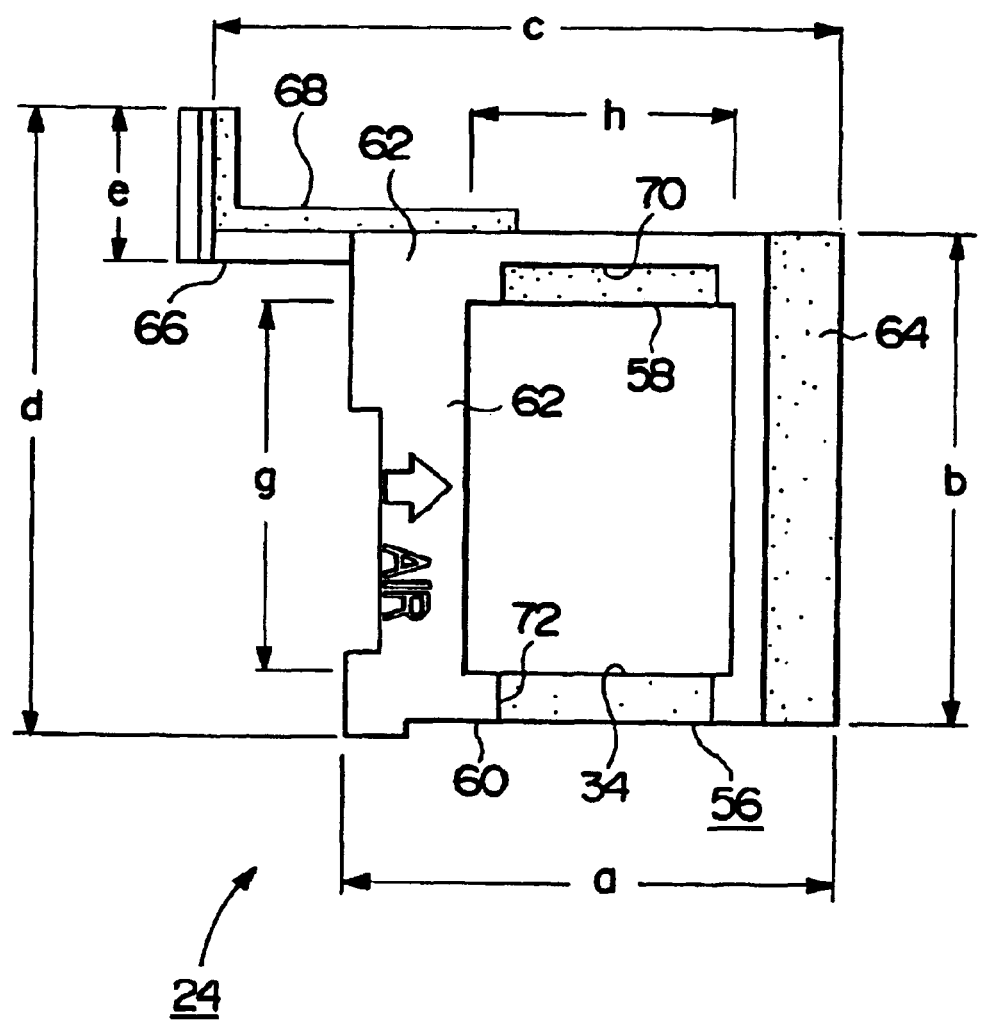
FIG. 9 is a plan view showing an air duct.
Figure 10:
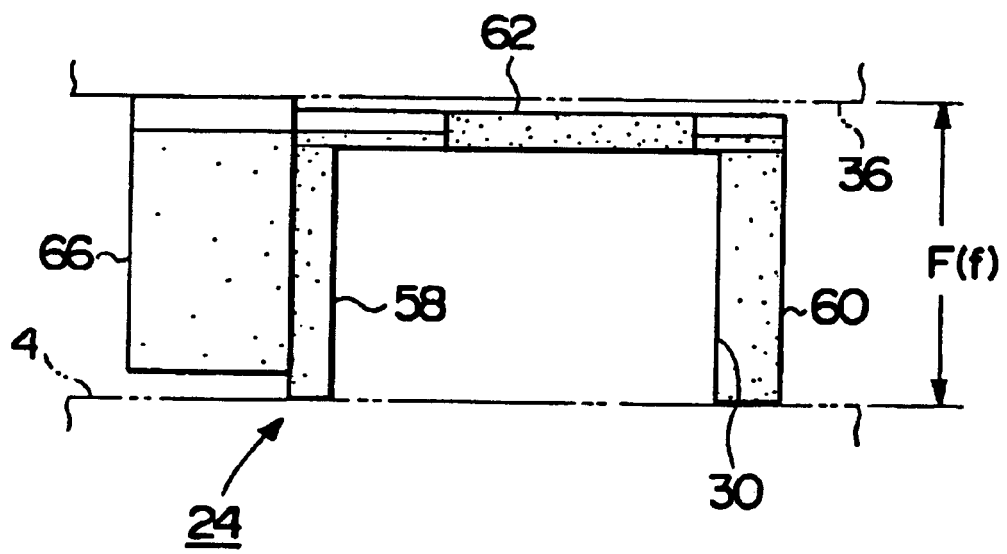
FIG. 10 is a front view showing an air duct.
Figure 11:
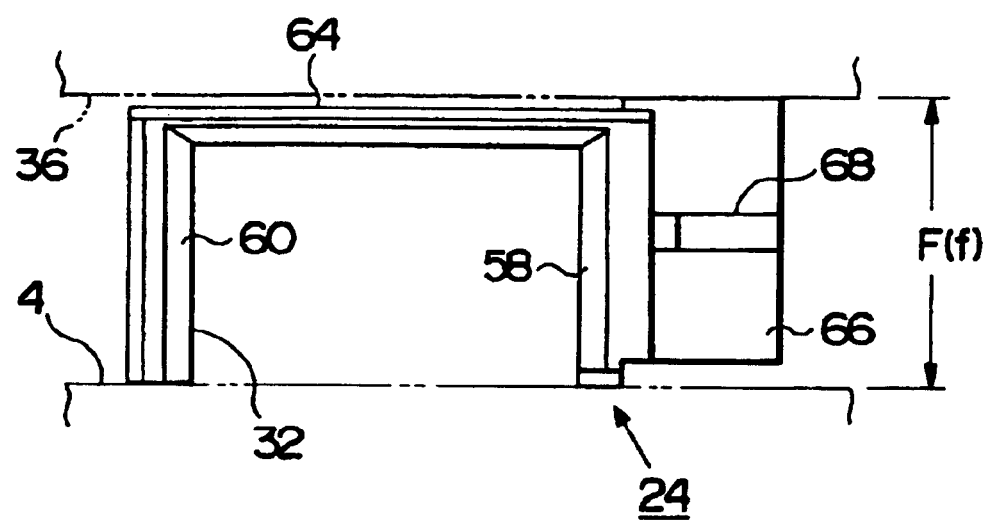
FIG. 11 is a rear view showing an air duct.
Figure 12:
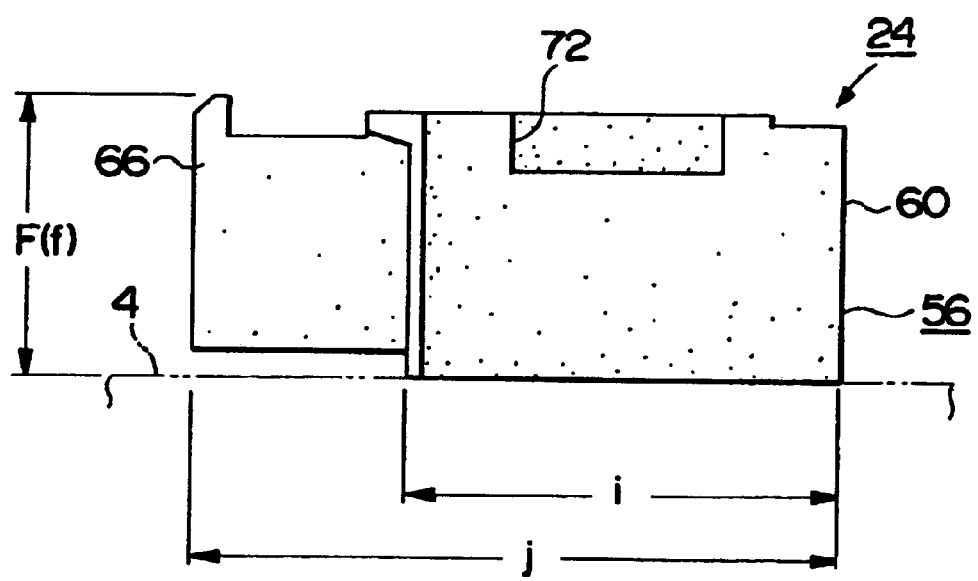
FIG. 12 is a side view showing an air duct.

The air duct 24 installed in such a space 20 has members depicted by length a, b, c, d, e, corresponding to the intervals A, B, C, D and E in the space 20 and i, j as shown in FIGS. 9 to 12. FIG. 9 is a plan view of the air duct 24, FIG. 10 is a front view thereof, and FIG. 11 is a rear view thereof and FIG. 12 is a side view thereof. In FIG. 9, depicted by a is a length of second vertical wall 60, b is a width including thickness of the first and second vertical walls 58, 60 at the exhaust part 32 side, c, d and e correspond to the interval C between the wall face of the power supply 18 and the outer face of the vertical wall 74, and the interval D between the inner wall face of the exterior case 4 and the outer face of the vertical wall 74, and the interval E between the vertical wall 74 and the hard disk 16, respectively. In this case, the members a, b, c, d and e and the intervals A, B, C, D and E can detachably mount and retain the air duct 24 in the space 20 by use of flexibility of the air duct 24 by setting the dimensions of the air duct 24 side slightly greater than those of the space 20 taking into account the elasticity of the air duct 24, i.e., flexibility of the air duct 24 formed of an elastic material of foaming plastics and so forth. In FIG. 9, depicted by g and h show the sizes of the edges of the first window 34 through which the fan unit 26 is attached to, or detached from the space 20. Further, with reference FIGS. 10 to 12, depicted by F is an interval between the bottom face of the exterior case 4 and the top plate 36, and it corresponds to a height f of the air duct 24. It is needless to say that the interval F and the height f serve to detachably mount and retain the air duct 24 in the space 20 by use of flexibility of the air duct 24 by setting the dimensions of the air duct 24 side slightly greater than those of the space 20 taking into account the elasticity of the air duct 24, i.e., flexibility of the air duct 24 formed of an elastic material of foaming plastics and so forth. In FIG. 12, depicted by i corresponds to the interval between the hard disk 16 and the power supply 18, and j encircles from the wall face of the power supply 18 to the vertical wall 74, and it shows the entire length of the air duct 24 including the support wall 66 which is installed in an interval between the vertical wall 74 and the fan unit 12 side.

Figure 13:
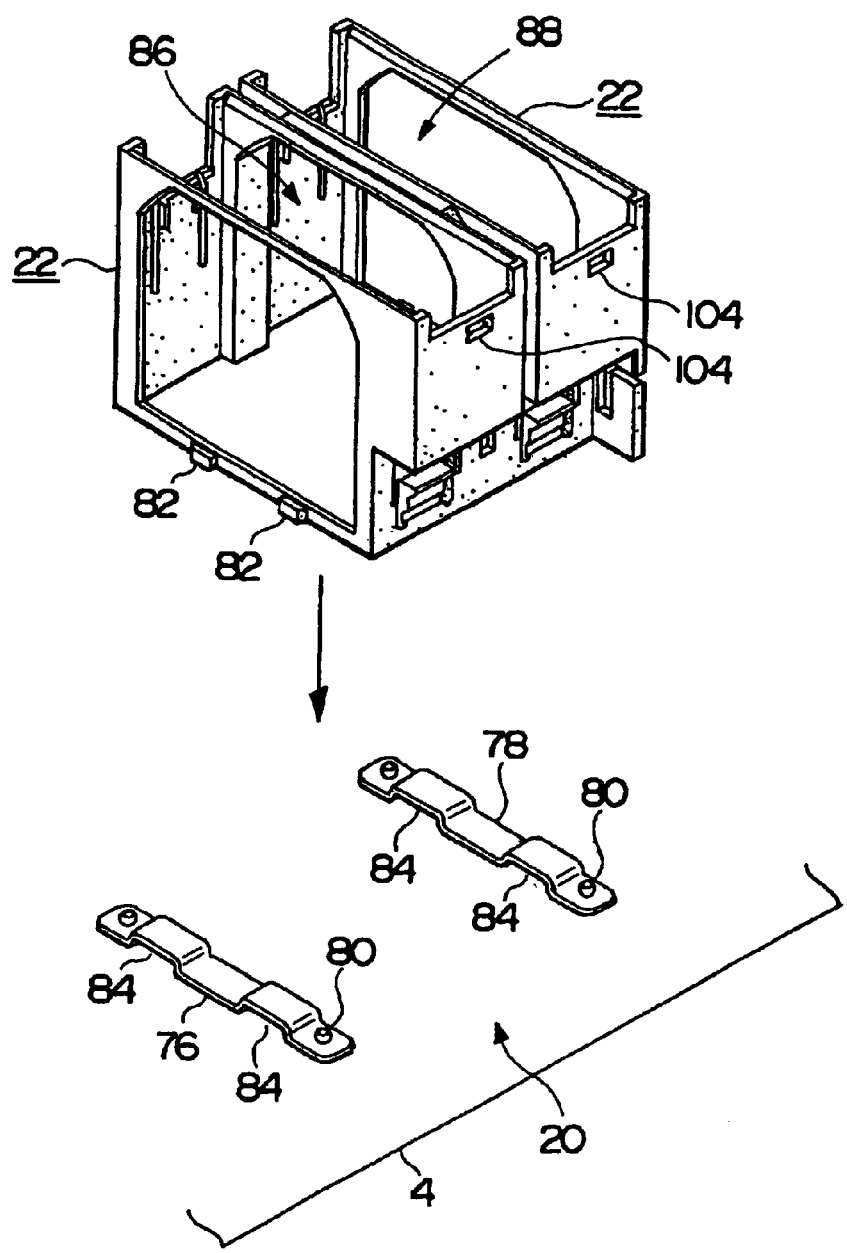
FIG. 13 is a perspective view showing a support frame and a fixture member thereof.
Figure 14:
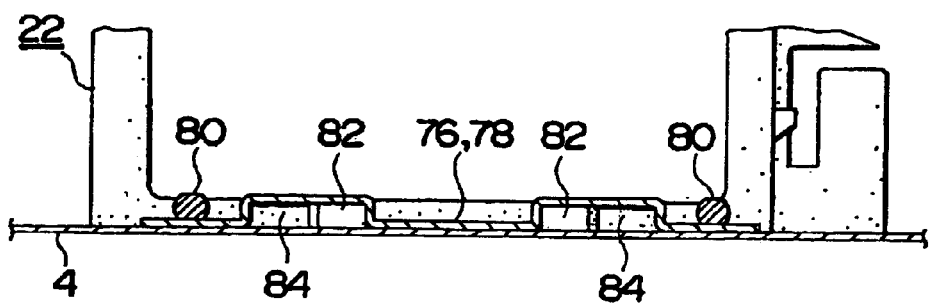
FIG. 14 is a sectional view showing a fixture structure of the support frame.

Fixture members 76, 78 for fixing the support frame 22 are fixed to the inner face of the exterior case 4 by rivets 80, screws and so forth as shown in FIG. 8, and a plurality of recesses 84, corresponding to a plurality of fixture juts 82 formed on the support frame 22 side, are formed on the fixture members 76, 78, for example, as shown in FIG. 13. FIG. 13 shows the fixture members and the support frame before the support frame is fixed. The fixture juts 82 of the support frame 22 are detachably inserted in the respective recesses 84, as shown in FIG. 14, and the support frame 22 is fixed to the exterior case 4 as shown in FIG. 15, and the space 20 in which the air duct 24 is installed is formed in the periphery of the support frame 22, as shown in FIG. 16.

Figure 15:
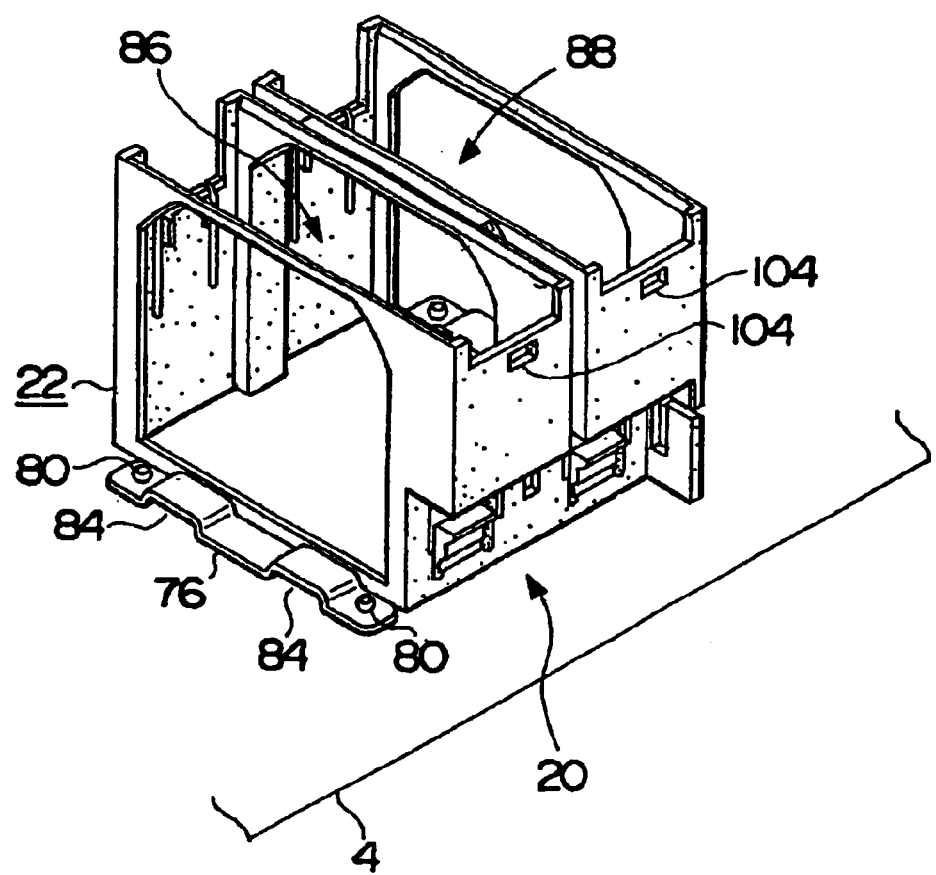
FIG. 15 is a perspective view showing a fixed support frame.
Figure 16:
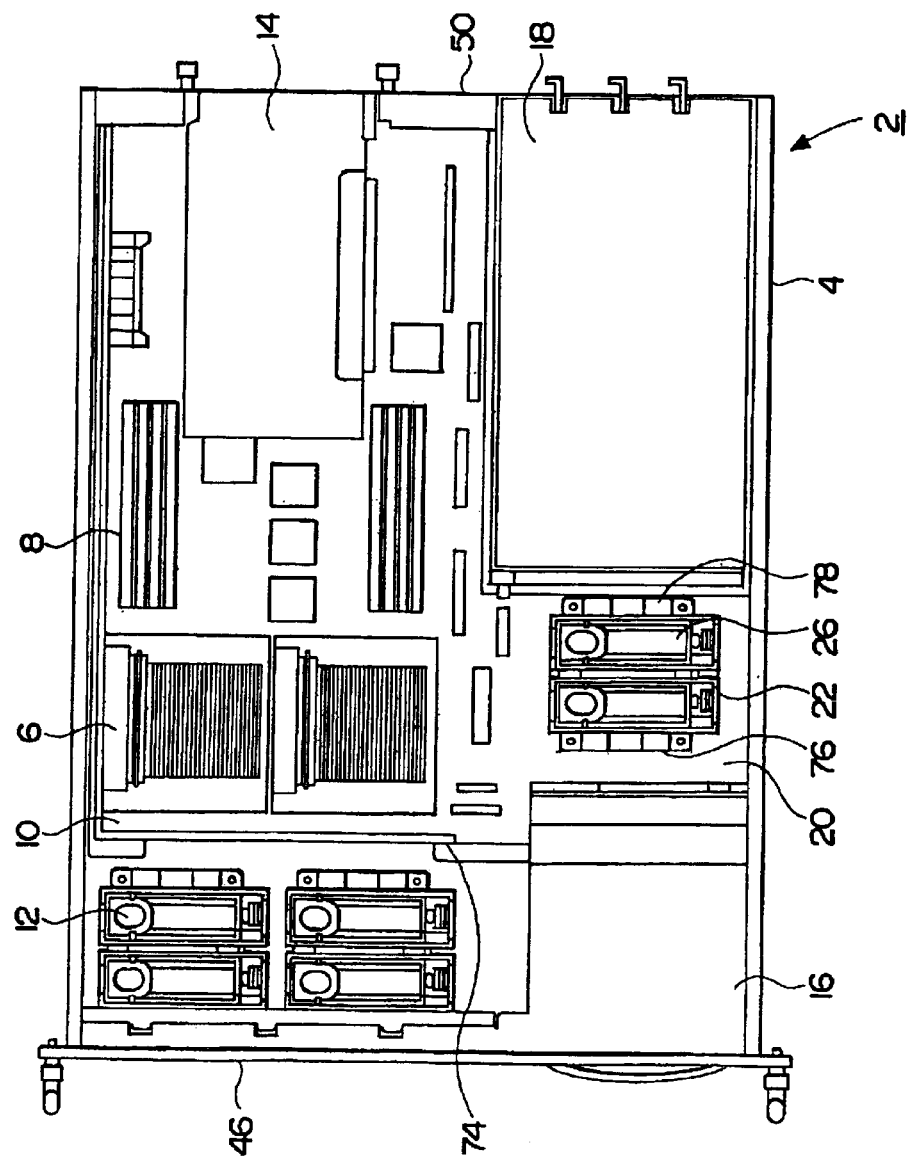
FIG. 16 is a plan view showing the electronic equipment before the air duct is installed.
Figure 17:
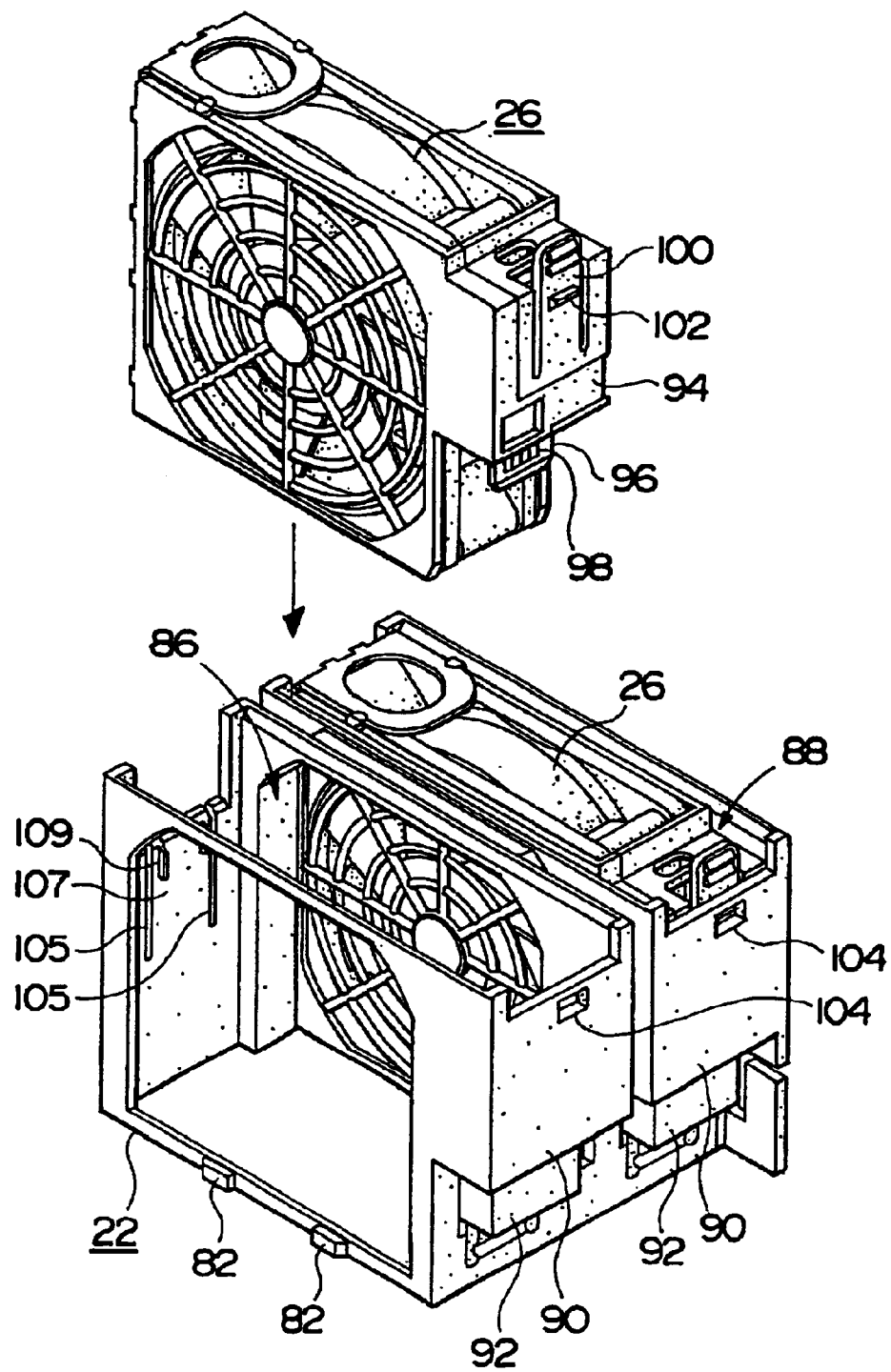
FIG. 17 is a perspective view showing the support frame and the fan unit.

Housing cases 86, 88 capable of installing therein two fan units 26 are formed in the support frame 22, as shown in FIGS. 13, 15 and 17. FIG. 17 shows the support frame 22 and the fan unit 26. A connection part 98 of a fan board 96 which is exposed under a pocket 94 of the fan unit 26 is inserted in a connector 92 provided under an exterior pocket 90 formed on side portions of the housing cases 86, 88, thereby electrically connecting between the connector 92 and the connection part 98. The fan board 96 is a printed circuit board on which a controller circuit, a sensor circuit and so forth are mounted. A power is supplied to the fan unit 26 by the electrical connection between the connection part 98 of the fan board 96 and each connector 92. According to this embodiment, although the support frame 22 in which two fan units 26 are installed is illustrated, the support frame 22 may be structured to be formed of only the housing case 86 in which the single fan unit 26 is mounted, or may be structured to be formed of the housing in which not less than three fan units 26 are installed.

The fan unit 26 has a fixture pawl 102 formed on an arm 100 which is bendably formed, and the fixture pawl 102 is detachably inserted into and retained by the fixture recess 104 formed on the exterior pocket 90 of the support frame 22, so that respective fan units 26 are mounted in the housing cases 86, 88 of the support frame 22. In this case, a fixture recess 104 is formed in the respective exterior pockets 90, and the respective fixture recesses 104 can be brought into engagement with the fixture pawl 102 formed on the outer face of the arm 100 provided in the pocket 94 of the respective fan units 26 by detachably inserting the fixture pawl 102 into the respective fixture recesses 104. In order to ensure the engagement, a pair of slits 105 are provided on a side face of the respective housing cases 86, 88 of the support frame 22, opposite from the respective exterior pockets 90, and a retainer piece 107 is bendably installed between the pair of slits 105. On the inner face of the retainer piece 107, a protrusion 109 butting against a side face of the fan unit 26 is formed. Because a distance between the protrusion 109 of the retainer piece 107 and the exterior pocket 90 is set so as to be slightly narrower than a width of the fan unit 26, the fan unit 26 inserted in the respective housing cases 86, 88 is butted against the protrusion 109 of the retainer piece 107 and is subjected to a pushing pressure toward the exterior pocket 90 side by the agency of elasticity of the retainer piece 107. Due to the pushing pressure and the engagement of the fixture pawl 102 with the respective fixture recesses 104, the fan unit 26 can be attached to, or detached from the respective housing cases 86, 88 of the support frame 22. In this case, thin portions are provided on the base portions at outer faces of the retaining piece 107 so as to improve flexuous property.

Figure 18:
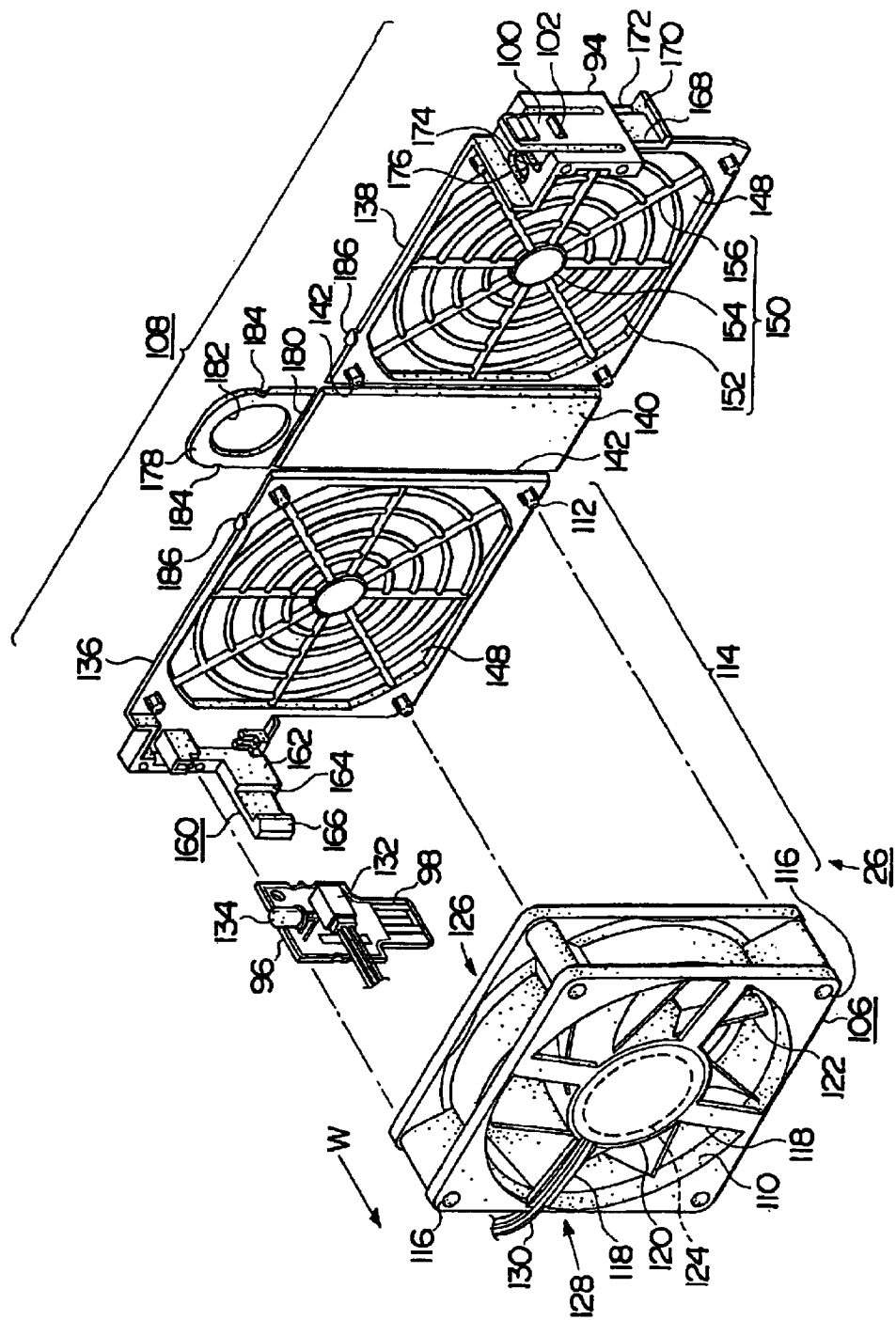
FIG. 18 is an exploded perspective view showing the fan unit.

The fan unit 26 comprises, e.g., a fan body 106, a casing 108 and so forth, as shown in FIG. 18. FIG. 18 shows the fan body 106, the fan board 96 and the casing 10B.

The fan body 106 is formed in the shape of, for example, a flat hexahedron, a vent 110 circular in shape is formed at the center of the fan body 106, and a fitting recess 116 into which a fitting jut 112 of the casing 108 is detachably fitted to thereby make up each of fitting parts 114 is provided in respective corners of the fan body 106, surrounding the vent 110. In the case of the present embodiment, the fitting recess 116 is a through-hole. A hub 120 at the center of the vent 110 is supported by a plurality of support arms 118 protruding form the fan body 106. The fan body 106 including the support arms 118, and the hub 120 and so forth is molded of, for example, is molded and worked, e.g., formed of plastics. The hub 120 is provided with a fan motor 124 for driving rotating blades 122 inside the vent 110. Intake and exhaust of air is effected so as to correspond to a rotating direction of the rotating blades 122 driven by the fan motor 124. With the present embodiment, cooling air W flows from, for example, the side of an intake face 126 toward the side of an exhaust face 128.

Lengths of wire 130, connected to the fan motor 124, are led to outside along one of the support arms 118 to be connected with a fan board 96 via a connector 132. A drive circuit for feeding the fan motor 124 with a drive current and an indicator 134 for displaying abnormality etc. of motor rotation are mounted on the fan board 96, and a connecting part 98 is formed at the lower end of the fan board 96. The indicator 134 is made up of a light emitting device such as, for example, a light emitting diode, and so forth.

The casing 108, for covering a plurality of faces of the fan body 106, comprises a plurality of casing sections including a first casing section 136, second casing section 138, and third casing section 140, and there are provided a plurality of hinge parts 142 between the first casing section 136 and third casing section 140 as well as between the second casing section 138 and third casing section 140, respectively, in such a way as to bendably support the first casing section 136 and second casing section 138 with the third casing section 140 clamped therebetween, respectively, those casing sections 136, 138, 140 together forming a linked body.

The casing 108 can be integrally molded of, for example, a thermoplastic or thermosetting synthetic resin. In the case of the casing 108 formed as above, while the hinge parts 142 are formed so as to smaller in wall thickness than the casing sections 136, 138, 140, respectively, the respective hinge parts 142 are freely bendable taking advantage of flexibility of a constituent material thereof, thereby bendably supporting the casing sections 136, 138, 140. For the hinge parts 142, use may be made of a mechanical hinge mechanism made up of a pivot pin and bearing parts.

The casing sections 136, 138 for covering the fan body 106 are provided with a vent 148 serving, respectively, and in the case of the present embodiment, a finger guard 150 providing a guard to serve as a protective wall for prevention of fingers and so forth from coming in contact with the rotating blades 122 is installed in the vent 148. In this case, the finger guard 150 is made up of a plurality of rings 152 concentrically arranged at appropriate intervals for blocking the fingers and so forth from being inserted into the vent 148, a hub 154 installed at the center of the vent 148, and a plurality of ribs 156 formed radially from the hub 154. Further, the finger guard 150 is formed integrally with casing sections 136, 138, respectively.

A plurality of the fitting juts 112 corresponding to the fitting recesses 116 of the fan body 106, respectively, are formed on the inner face of the casing sections 136, 138, respectively, and the fan body 106 is united with the casing sections 136, 138, respectively, by fitting each of the fitting juts 112 into the respective fitting recesses 116.

A pocket 94, for not only retaining the fan board 96 at a position protruded from the intake face 126 as well as the exhaust face 128 of the fan body 106 but also protecting the fan board 96, is formed for the casing sections 136, 138 and a width of the pocket 94 is set so as to be identical to that of the casing section 140.

The pocket 94 is provided with a coupling part 160 for implementing detachable coupling between the casing section 136 and the casing section 138. In this case, a protrusion 162, a butting part 164 and a fixture pawl 166 are formed at the first casing section 136 side while a butting part 168 corresponding to the butting part 164, a groove 170 in which the protrusion 162 is inserted, and fixture recess 172 in which the fixture pawl 166 is inserted are formed at the second casing section 138 side. Accordingly, the casing sections 136, 138 are fixedly held together with the fixture recess 172 and the fixture pawl 166 on the edges thereof.

A cutout 174 providing room for bending of the arm 100 as well as a window 176 for checking the indicator 134 of the fan board 96 housed in the pocket 94 is formed on the rear face of the arm 100.

The casing section 140 is provided with a pull 178 for use in attaching and detaching operation of the casing 108. The pull 178 is bendably formed through the intermediary of a hinge part 180. The hinge part 180 is formed smaller in wall thickness than the pull 178 and casing section 140, so that the hinge part 180 is rendered bendable owing to flexibility of the constituent material thereof. For the hinge part 180, use may be made of a mechanical hinge mechanism made up of a pivot pin and bearing part. A through-hole 182 capable of allowing a finger to be inserted therein is formed in the pull 178, and on both edges of the pull 178, a pair of retaining recesses 184 each having a conical surface is formed. A pair of pawls 186, corresponding to the retaining recesses 184, respectively, is formed on the respective upper edges of the casing sections 136, 138.

With such a construction, the fan body 106 is enclosed by the casing 108 to be united therewith to form the fan unit 26, and it is installed on the support frame 22 so as to be installed on the electronic equipment 2. The air duct 24 is installed in the space 20 formed in the periphery of the fan unit 26 and the support frame 22. That is, on the midway of the ventilation path 28 of the air duct 24, the fan unit 26 is installed together with the support frame 22 attached to the exterior case 4.

Figure 19:
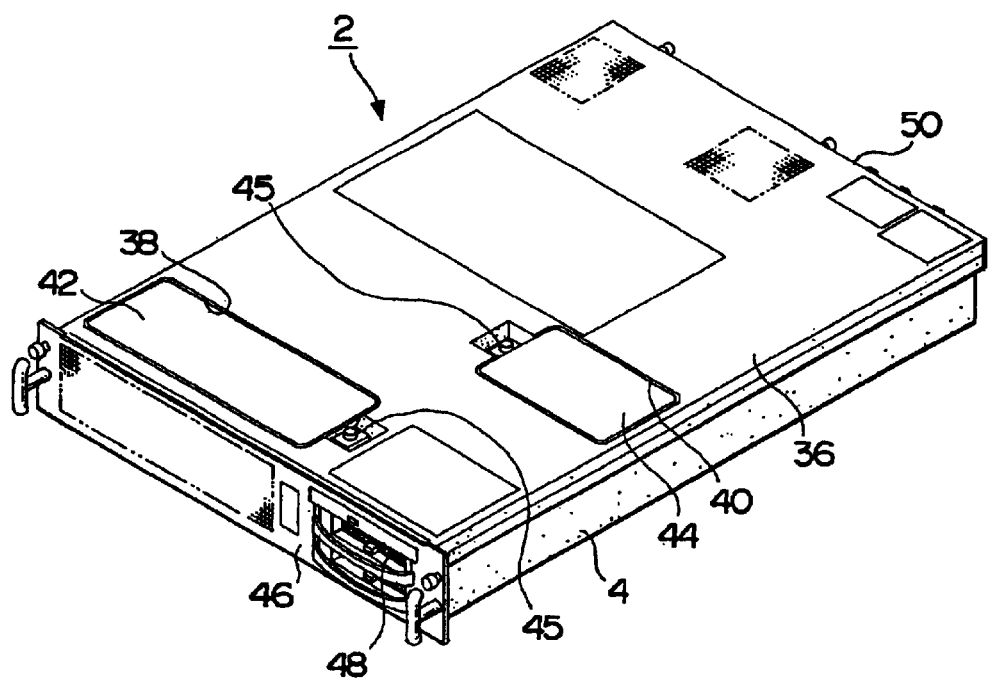
FIG. 19 is a perspective view showing the assembled electronic equipment.

Then, as shown in FIG. 19, the top plate 36 is attached to the exterior case 4, and the air duct 24 installed in the space 20 is clamped between the bottom face of the exterior case 4 and the top plate 36 to be fixedly held. Since the air duct 24 is formed of an elastic material, a part of the air duct 24 is held in the space 20 in a contacted state under pressure by the agency of elasticity thereof while it is firmly fixed between the exterior case 4 and the top plate 36 in a compressed state.

Accordingly, the cooling air W which is taken toward the hard disk 16 side serving as the low heat generation equipment through the slit 48 of the front face panel 46 by the rotation of the fan unit 26 passes through the hard disk 16 and flows to the power supply 18 serving as the high heat generation equipment after passing through the ventilation path 28 of the duct body 56, and it is exhausted from the slit 52 of the rear face panel 50 after passing through the power supply 18. The hard disk 16 and the power supply 18 are cooled by the common air duct 24 and the fan unit 26, effective cooling structure and cooling function are attained due to the common use of the air duct 24 and the fan unit 26.

Figure 20:
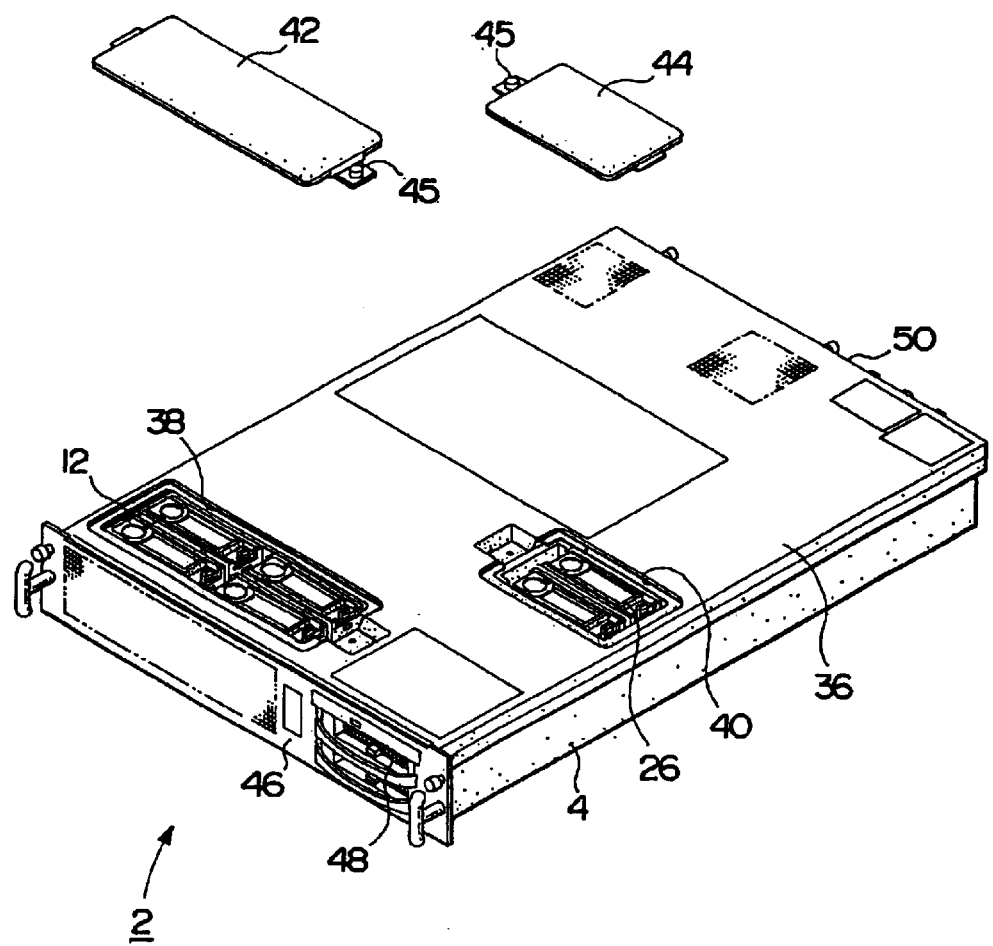
FIG. 20 is a perspective view showing the electronic equipment from which a cover member is separated.

With the electronic equipment 2, as shown in FIG. 20, the cover members 42, 44 can be opened, and the fan unit 12 or the fan unit 26 can be attached to, or detached from the electronic equipment 2 through the windows 38, 40. Since the fan unit 26 can be installed on the support frame 22 and can be taken out through the window 34 of the air duct 24 and the window 40 of the top plate 36, attachment and detachment of the top plate 36 is not necessary when installing or removing the fan unit 26, so that attachment and detachment of the fan unit 26 can be implemented with ease. The maintenance of the fan unit 26 is easily made by adopting such air duct 24 and housing structure.

Figure 21:
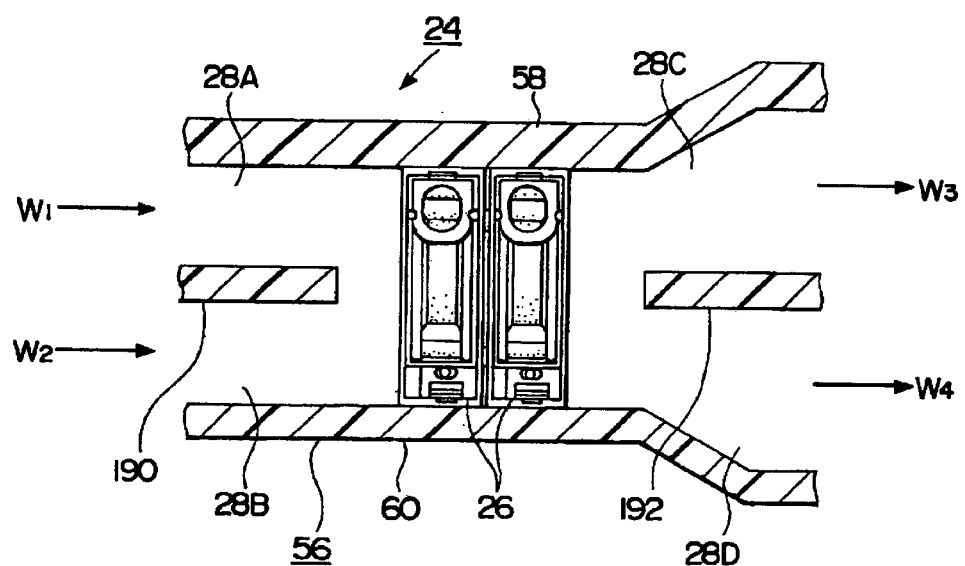
FIG. 21 is a view showing an air duct according to a second embodiment of the invention.

Second Embodiment:

A second embodiment of the invention is now described. FIG. 21 is an air duct according to the second embodiment of the invention. Although a single ventilation path 28 is formed in the air duct 24 in the first embodiment, as shown in FIG. 21, for example, a plurality of branched ventilation paths 28A, 28B which are formed by branching air by providing an upright vertical wall 190 may be formed at the upperstream side, while a plurality of branched ventilation paths 28C, 28D which are formed by branching air by providing an upright vertical wall 192 may be formed at the downstream side. With the provision of the plurality of ventilation paths 28A, 28B, 28C, 28D, cooling air $W_1$, $W_2$ is sucked in through the ventilation paths 2BA, 28B, and cooling air $W_3$, $W_4$ is allowed to flow through the ventilation paths 28C, 28D by use of common air duct 24 and the fan unit 26.

With such a construction, components at a plurality spots can be cooled by use of a single air duct 24 and fan unit 26, further, for example, the temperature of the cooling air $W_1$ which is heated at the upperstream side can be cooled by mixing with the cooling air $W_2$, thereby attaining effective cooling structure and cooling function.

Having extracted technical items from the above-described embodiment of the electronic equipment and the air duct, respectively, there are enumerated hereinafter technical significance thereof, variations thereof, other items of technical extension, and so forth.

(1) With air duct 24 having such a structure, the single duct body 56 formed of an elastic material such as plastics and so forth can attain ducting and also attains ducting corresponding to the shape of the space 20 of the interior of the equipment. Further, the duct body 56 can be formed by a mold of an elastic material such as a plastic and so forth, so that the number of components can be reduced. Further, since the duct body 56 can be easily deformed due to the flexibility and elasticity of the material, it can be fixed in the space 20 of the interior of the equipment 2 due to its elasticity, so that when fixing, assembling or disassembling the duct body 56, fixture components such as fixture screws and drivers, etc. are not required, thereby simplifying or reducing the number of working steps of fixing, assembling or disassembling. Further, the cooling air W is allowed to flow toward the specific cooling position through the ventilation path 28 of the duct body 56 without wasting. As for the elastic material forming the duct body 56, noncombustible pulp may be used in addition to a plastic.

(2) Since the duct body 56 has at least a part of a shape, for example, a width, identical to that of the space 20 defined in the interior of the equipment, it has a structure to be clamped in the space 20 to be detachably held. Accordingly, fixing, assembling or disassembling the duct body 56 in the space 20 of the equipment can be implemented with ease, so that fixture screws and tools, etc., are not required (3) The duct body 56 has a very simple structure such that it comprises the first vertical wall 58 installed along the component facing the space 20 of the interior of the equipment and the second vertical wall 60 spaced from the first vertical wall and installed in the space 20 along the exterior case 4 and the component, wherein the vertical walls 58, 60 are supported by the bridging parts 62, 64, bridging over the vertical walls 58, 60. According to such a structure, the duct 56 can be integrally molded of a foaming plastic with ease. Although two bridging parts 62, 64 are used according to the present embodiment, one or not less than three bridging parts may be used.

(4) The ventilation path 28 is formed including a part of the exterior case 4 serving as a housing of the electronic equipment 2 and the top plate 36. Therefore, the duct body 56 can be downsized. The housing of the electronic equipment 2 can be made up of a chassis and so forth in addition to the exterior case 4.

(5) Although the fan unit 26 detachably attached to the electronic equipment 2 is installed in the ventilation path 28 of the duct body 56, since the window 34 through which the fan unit can pass is formed in the ventilation path 28, the fan unit can be attached to, or detached from the electronic equipment 2 in a state where the duct body 56 is installed.

(6) The duct body 56 can be conductive by allowing a plastic used as the constituent material thereof to contain an electrically conductive material therein. The duct body 56 can be installed while being brought in contact with the exterior case 4 or a chassis made up of a conductive body, thereby attaining electromagnetic shielding together with the chassis and the exterior case 4 or the top plate 36. In another means of implementing electromagnetic shielding, the electromagnetic shielding thereof can be similarly attained by applying vapor deposition of a metal to either or both of the inner wall or outer surface of the duct body 56 to allow the surface thereof to be conductive. Irradiation of electromagnetic waves from the duct body 56 and invasion of electromagnetic waves into the duct body 56 can be prevented due to such electromagnetic shielding.

(7) It is not necessary for the duct body 56 to have a single ventilation path 28, for example, as shown in FIG. 21, if a plurality of ventilation paths 28A, 28B, 28C, and 28D are formed by branching the single ventilation path 28, the cooling air $W_1$, $W_2$, $W_3$ and $W_4$ and so forth can be guided to a plurality of cooling spots, for example, not less than two spots in the equipment, so that effective cooling structure and function can be attained.

(8) Electrostatic preventing is attained by applying electrostatic preventing agent onto the duct body 56 or by molding the duct body by mixing the electrostatic preventing agent with an elastic material forming the duct body 56. If the duct body 56 can attain electrostatic preventing, it can be installed at the part on the printed board which is to be cooled, for example, at the CPU part, cooling air W can be supplied to a desired cooling point.

(9) Although information processing equipment such as a server and so forth is exemplified as the electronic equipment 2 with the present embodiment, the invention can be applied to various equipment and devices such as communication equipment and so forth, which require cooling by cooling air W.

(10) Since the duct body 56 has the first window 34 which is used when the fan unit 26 is attached to or detached from the duct body 56, the second window 40 corresponding to the first window 34 on the top plate 36 forming a part of the housing, and the cover member 44 for closing and opening the windows 34, 40, the inspection and replenishment of the fan unit 26 can be effected by closing and opening the cover member 44 with ease. With the present embodiment, the inspection of the fan unit 12 can be effected similarly.

(11) Since the duct body 56 can be formed by use of an elastic material such as foaming plastics or noncombustible pulp and has the ventilation path 28 corresponding to the space 20 in the interior of the equipment, it can be fixed in the space 20 with ease taking advantage of elasticity and flexibility of a constituent material of the duct body 56.

(12) Although the duct body 56 can be clamped to be held in the space between various equipment and components installed in the electronic equipment 2, it may be clamped to be held in the space between the bottom face part and the upper face part of the exterior case 4 of the equipment, or in the space between the exterior case 4 and the top plate 36. With such a structure, a desired holding strength can be obtained.

(13) If the window 34 or the bottom face part in an opened state of the duct body 56 is closed by a part of the housing made up of the exterior case 4 and the top plate 36, closing structure of the window 34 can be simplified, thereby increasing the internal volume of the ventilation path 28.

(14) If a low heat generation equipment is installed at the upperstream side of the cooling air, a high heat generation equipment is installed at the downstream side thereof, the space 20 is formed between the low heat generation equipment and the high heat generation equipment, the air duct 24 is installed in the space 20 to form the ventilation path 28, and the fan unit 26 is installed in the ventilation path 28, the cooling air W can be sucked from the low heat generation equipment side, then the cooling air W which passed through the low heat generation equipment side can be allowed to flow to the high heat generation equipment side, so that both of the low heat generation equipment and the high heat generation equipment can be cooled by the common fan unit 26, thereby attaining an effective cooling structure.

(15) Described above in the case of the electronic equipment 2 where the fan unit 26 is installed in the ventilation path 28 of the duct body 56, other equipment instead of the fan unit 26 maybe installed inside the ventilation path 28 and the other equipment may be installed together with the fan unit 26.

(16) Although the fan board 96 made up of a printed board is used with the present embodiment, a hybrid IC may be installed instead of the fan board 96.

As described in detail above, although the invention has been described with reference to the most preferable embodiment, the invention is not limited thereto, and needless to say that various modifications and changes can be made by a person skilled in the art based on the gist of the invention as disclosed in claims, the detailed description of the invention, and such modifications and changes are included in the scope of the invention.

The entire disclosure of Japanese Patent Application No. 2003-19432 including specification, claims, drawings and summary are incorporated herein by reference in its entirety.

What is claimed is:

1. An air duct installed in a housing of an electronic equipment, comprising:
   a duct body detachably installed in the housing in which one or not less than two equipment is installed, the duct body being formed independently of the housing; being made of foaming plastic to have elastic properties thereof; having at least a part of the dimensions set greater than those of a space provided in the interior of the housing; being clamped in the space; and being held in the space by the elastic properties thereof, wherein the duct body further includes:
   a ventilation path through which air in the housing is allowed to pass toward the duct body;
   an intake part for taking the air in the ventilation path; and
   an exhaust part for exhausting the air having passed the ventilation path to the inside or outside of the housing.

2. An air duct according to claim 1, wherein said duct body further comprising:
   a first vertical wall formed along the interior walls of the housing that forms the space in the housing, or along the exterior walls of the equipment;
   a second vertical wall spaced from the first vertical wall, and formed along the interior walls of the housing that faces the space, or along the exterior walls of the equipment;
   a first bridging part bridging over the first vertical wall and second vertical wall for supporting the first vertical wall and the second vertical wall; a second bridging over the first vertical wall and the second vertical wall for supporting the first vertical wall and the second vertical wall; and
   a window formed in said duct body by the first vertical wall, the second vertical wall, the first bridging part, and the second bridging part, through which a fan unit can pass, the fan unit being installed in the ventilation path,
   wherein any one or all of the dimensions of the first vertical wall, the second vertical wall, and the bridging parts are set greater than those of the space.

3. An air duct according to claim 1, wherein said duct body is formed of the foaming plastic and attains electromagnetic shielding to shield electromagnetic field.

4. An air duct according to claim 1, wherein said duct body is formed of the foaming plastic and attains electrostatic stopping.

5. An air duct according to claim 2, wherein the window formed in said duct body is opened/closed by a part of the housing of the electronic equipment.

6. An electronic equipment comprising one or not less than two various equipment in a housing, comprising:
   an air duct detachably installed in the housing in which one or not less than two equipment is installed, the air duct being formed independently of the housing; being made of foaming plastic to have elastic properties thereof; having at least a part of the dimensions set greater than those of a space provided in the interior of the housing; being clamped in the space; and being held by the elastic properties thereof, wherein the air duct further includes:
   a ventilation path through which air in the housing is allowed to pass toward the duct body;
   an intake part to taking the air in the ventilation path;
   an exhaust part for exhausting the air having passed the ventilation path to the inside or outside of the housing; and
   a fan unit installed in the ventilation path of this air duct to flow the air into the ventilation path.

7. An electronic equipment comprising one or not less than two various equipment in a housing, comprising:
   an air duct detachably installed in a space of the housing to form the ventilation path through which air is allowed to flow in the housing;
   a fan unit installed in this air duct;
   a first window provided in the air duct and through which the fan unit is attached to, or detached from the air duct;
   a second window formed in the housing corresponding to the first window; and
   a cover member detachably provided in the housing for opening and closing the first and second windows.

8. An electronic equipment comprising low heat generation equipment and high heat generation equipment in a housing, comprising:
   a space provided between low heat generation equipment and high heat generation equipment; and
   an air duct installed in the space provided between the low heat generation equipment and the high heat generation equipment, being formed independently of the housing; being made of foaming plastic to have elastic properties thereof; having at least a part of the dimensions set greater than those of a space provided in the interior of the housing; being clamped in the space; and being held detachably in the space by the elastic properties thereof; and having a ventilation path therein, wherein a fan unit is installed in the ventilation path to flow air, and
   wherein cooling air is forced to flow through the low heat generation equipment is allowed to flow toward the high heat generation equipment via the ventilation path.

* * * * *

UNITED STATES PATENT AND TRADEMARK OFFICE
CERTIFICATE OF CORRECTION

| | | |
|---|---|---|
| PATENT NO. | : 7,068,505 B2 | Page 1 of 1 |
| APPLICATION NO. | : 10/740841 | |
| DATED | : June 27, 2006 | |
| INVENTOR(S) | : Naofumi Kosugi | |

It is certified that error appears in the above-identified patent and that said Letters Patent is hereby corrected as shown below:

First Page Column 2 (Other Publications), Line 4, After "10/740,797" insert --,--.

First Page Column 2 (Abstract), Line 7, change "paths" to --path--.

Column 14, Line 17, after "part" change "to" to --for--.

Column 14, Line 53, change "air" to --air that--.

Signed and Sealed this

Twenty-fourth Day of July, 2007

JON W. DUDAS
*Director of the United States Patent and Trademark Office*